Figure 1:
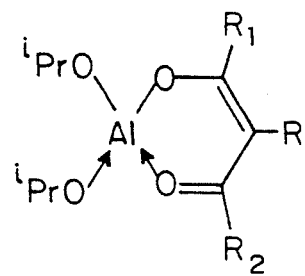

United States Patent [19]

Brierley et al.

[11] Patent Number: 5,045,348
[45] Date of Patent: Sep. 3, 1991

[54] THIN FILM DEPOSITION PROCESS

[75] Inventors: Crofton J. Brierley, Pattishall; Clive Trundle, Towcester, both of England

[73] Assignee: Plessey Overseas Limited, Ilford, England

[21] Appl. No.: 295,212

[22] PCT Filed: Mar. 25, 1988

[86] PCT No.: PCT/GB88/00228
§ 371 Date: Jan. 5, 1989
§ 102(e) Date: Jan. 5, 1989

[87] PCT Pub. No.: WO88/07759
PCT Pub. Date: Oct. 6, 1988

[30] Foreign Application Priority Data

Mar. 26, 1987 [GB] United Kingdom ............... 8707322

[51] Int. Cl.$^5$ .............................................. B05D 3/06
[52] U.S. Cl. ................................. 427/54.1; 427/248.1
[58] Field of Search .......................... 427/54.1, 248.1; 428/702

[56] References Cited

U.S. PATENT DOCUMENTS 4,533,852  8/1985  Frank et al. ........................... 445/50
4,735,852  4/1988  Osada .................................... 427/40

FOREIGN PATENT DOCUMENTS 0022349  1/1981  European Pat. Off. .
0055459  7/1982  European Pat. Off. .
61-190074  8/1986  Japan ................................. 427/54.1

OTHER PUBLICATIONS

Kaplan et al., CVD Deposition of Tantalum Pentoxide Films, Journal of Electrochemical Society, vol. 123, No. 10, 1976.

Primary Examiner—Stanley Silverman
Attorney, Agent, or Firm—Fleit, Jacobson, Cohn, Price, Holman & Stern

[57] ABSTRACT

A thin film deposition process for depositing a metal oxide layer onto a substrate body, the process comprising the steps of taking a metal organic compound in vapor form, the compound being capable of absorbing light in the wavelength range of 240 to 400 nanometers, heating the substrate to a temperature below the pyrolytic decomposition temperature of the compound in the presence of the vapor, directing light towards the substrate to cause a photochemical fragmentation of said vapor molecules, the reaction resulting in a deposition of the required oxide on said substrate.

The metal organic compound may be a metal alkoxy substituted beta-diketonate such as aluminium diisopropoxide acetyl acetonate.

4 Claims, 1 Drawing Sheet

THIN FILM DEPOSITION PROCESS

This invention relates to a thin film deposition process. It relates particularly to such a process which can be used for the thin film deposition of various dielectric layers for electronic applications.

The present invention was devised in an attempt to provide a low temperature technique that could be used for the area selective deposition of thin film dielectric materials based on oxides or nitrides. The method chosen was to irradiate a substrate body with ultraviolet light whilst passing a vapour of an organometallic compound over the substrate, such that the organometallic compound would absorb the incident light and undergo photofragmentation to form a product that would deposit on the substrate surface.

Such a process has been used already for the deposition of a wide range of metal containing compounds and it has often been necessary to use a light source producing very short wavelengths (about 200 nanometers) of radiation in order to achieve the required level of photo absorption in the available precursor materials. Such a light source is often not readily available and it is relatively costly one to provide. It may also require expensive optics or the need to eliminate the presence of oxygen from the light path.

It would therefore be more convenient to use a different type of radiation source which is more freely available and which produces a longer wavelength (for example, 250 to 400 nanometers) of radiation. However, it was found that the precursors which are commonly used for metal oxide deposition, which are alkoxide compounds, do not significantly absorb light at wavelengths greater than 200 nanometers.

An object of the present invention, therefore, was to provide precursor compounds for metal oxide deposition which compounds would have satisfactory absorption bands for light of the longer wavelength.

According to the invention, there is provided a metal oxide deposition process, in which an organometallic precursor compound is a metal alkoxy substituted beta-diketonate. In the beta-diketonate, the alpha-substitutions to the oxygen atoms may be individually selected from alkyl, fluorinated alkyl, alkoxy or aryl and the beta-substitution to the oxygen atoms is selected from hydrogen, halogen or lower alkyl.

Preferably, the compound is capable of absorbing light in the wavelength range of 240 and 400 nanometers. A more preferred range is between 250 and 300 nanometers.

The diketonate may be aluminium diisopropoxide acetyl acetonate.

According to a further aspect, there is provided a thin film deposition process in which a dielectric layer may be laid down on a substrate body surface at a comparatively low temperature, the process comprising the steps of taking a metal organic compound in vapour form the compound being capable of absorbing light in the wavelength range of 240 to 400 nanometers, heating the substrate body to a temperature below the pyrolytic decomposition temperature of the compound in the presence of the vapour, directing light of a predetermined wavelength towards the substrate to cause a photochemical fragmentation of said vapour molecules, the reaction resulting in a deposition of the required oxide on said substrate.

The metal organic compound may be a metal alkoxy substituted beta-diketonate such as aluminium diisopropoxide acetyl acetonate.

The invention further comprises an electronic device including a thin oxide layer deposited by the abovementioned process.

Figure 2:
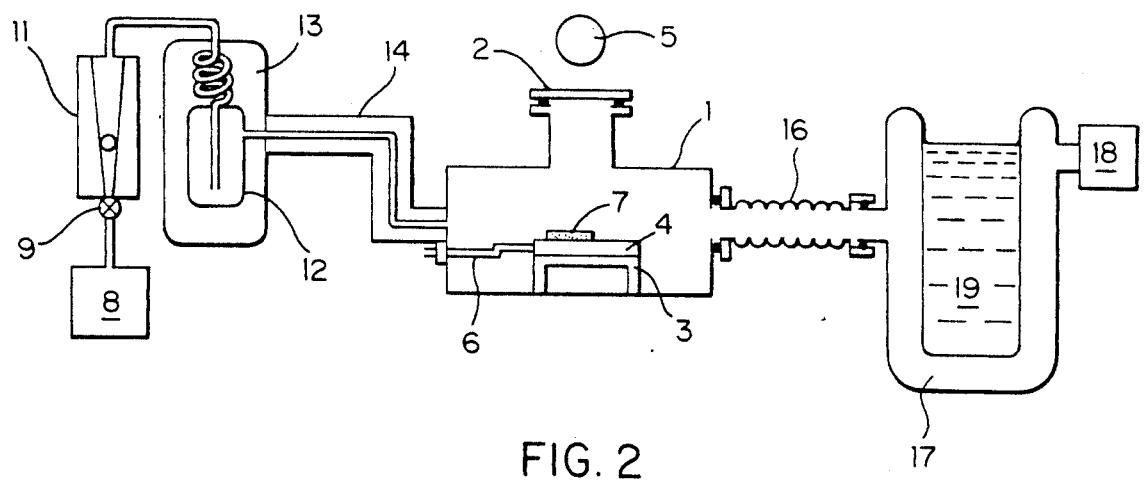
Figure 3:
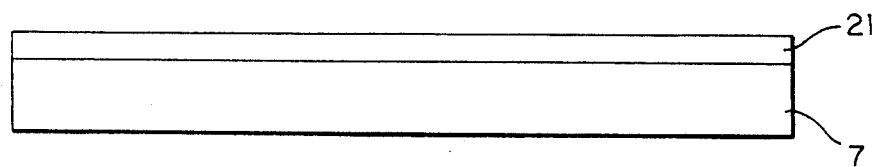

By way of example, a particular embodiment of the invention will now be described with reference to the accompanying drawing, in which:

FIG. 1 shows the general formula and structure of one type of organoaluminium compound of the invention, FIG. 2 shows apparatus for carrying out the process of the invention, and, FIG. 3 shows a substrate body supporting a deposited metal oxide layer.

In the organoaluminium compound of FIG. 1, R is preferably hydrogen but it may alternatively be halogen or a low molecular weight alkyl. The radicals $R_1$ and $R_2$ may be individually selected from the group of alkyl, alkoxy, aryl, or fluorinated alkyl.

The preferred substitutions to be incorporated depend on the intended light source to be used. For illumination by an unfiltered mercury lamp the preferred compound would be one where $R=H$ and $R_1=R_2=CH_3$ since this compound absorbs light strongly at wavelengths between 240 and 300 nanometers and has high volatility.

The wavelength at which maximum absorption occurs is 380 nanometers and this compound is found to be one of the most volatile of this group of precursors. Where a monochromatic illumination source, such as the 257 nanometer line from a frequency doubled argon ion laser is used then the absorption peak may be localised to coincide with that line. Thus, for 257 nanometers, the preferred compound would be $R=H$ and $R_1=R_2=OC_2H_5$, since this compound has a photoabsorption peak at 257 nanometers and possesses a reasonable volatility. In alternative compound, $R_1=OCH_3$, $R_2=CH_3$ and this has a photoabsorption peak at 261 nanometers in the vapour. A general method for the synthesis of these various metal oxide precursors with $R=H$ and $R_1=R_2=CH_3$ will be described later.

As depicted in FIG. 2, the deposition apparatus comprises a stainless steel deposition chamber 1 provided with an ultraviolet transmission window 2 of quartz. The chamber 1 contains a table 3 which supports a steel heater block 4 having electrical supply leads 6. The heater block 4 is in contact with a substrate body 7 upon an upper surface of which the required metal oxide layer is to be deposited. Outside the window 2 is located a light source 5.

A carrier gas supply for the chamber 1 is provided by an argon gas supply source 8 which delivers a gas stream passing through a needle valve 9 connected to a gas flow meter 11 and then through a bubbler tube 12 surrounded by a heating oil jacket 13. The bubbler tube 12 is filled with a volatile liquid precursor of the metal compound required to be deposited in the chamber 1.

The gas flow outlet from the bubbler tube 12 passes through further tubing surrounded by a heating jacket 14 and then enters the chamber 1.

A gas outlet from the chamber 1 passes through a length of flexible vacuum tubing 16 which conducts exhausted gas between the walls of a glass dewar flask 17 and thence to a vacuum system 18. The dewar flask 17 is filled with a liquid nitrogen coolant 19.

Use of this apparatus to deposit a metal oxide film will be explained shortly, after the synthesis of one precursor compound, diisopropoxy aluminium acetylacetonate has been described.

In order to prepare the precursor, pentan-2,4-dione (6.56 g) was added to aluminium isopropoxide (13.4 g) in benzene (120 milliliters) and the mixture was heated under reflux conditions for two hours. The resulting solution was slowly distilled until the vapour temperature rose to 80° C. The remaining benzene was rapidly distilled off. The oil which resulted was distilled under vacuum to yield diisopropoxy aluminium acetylacetonate as a pale yellow oil that became crystallised upon being left to stand for several days.

In order to deposit the required metal oxide, the precursor compound just described was loaded into the bubbler tube 12 and this was heated by the oil jacket 13 to 125° C. The deposition chamber 1 and bubbler tube 12 were held under reduced pressure by means of the vacuum system 18 which was constituted by a large capacity rotary pump backing an oil diffusion pump. A carrier gas was bubbled through the aluminium compound and argon was used to flush the chamber window to give a chamber pressure of about 0.5 mbar. Volatile reactants and reaction products were condensed in the liquid nitrogen cold trap formed by the dewar flask 17 before the non-condensable vapours entered the vacuum system 18.

The light source 5 was formed by a mercury arc lamp of one kilowatt power. The light was focussed through the window 2 onto the substrate 7 which was maintained at a temperature of 200° C. by the heater 4.

Use of these process conditions resulted in the formation of an aluminium oxide film 21 (FIG. 3) on the substrate 7 surface. No deposition was found to occur in the absence of illumination, although deposition could be made to take place by the step of raising the substrate temperature to 500° C.

The advantages of this use of a metal diketonate for oxide deposition include the feature that the photoabsorption of the metal oxide precursors may be matched, by appropriate substitution, to the irradiation source being used. A range of possible compounds which have been synthesized in the laboratory is given in the following Table with some physical characteristics.

TABLE

| Compound Number | Substituents for diisopropoxy aluminium diketonate | Physical Characteristics | Vapour Pressure at 120° C. (milli-bars) | Wavelength of Absorption Maximum (nanometers) |
|---|---|---|---|---|
| 1 | R = H<br>$R_1$ = $OC_2H_5$<br>$R_2$ = $OC_2H_5$ | Extremely viscous colourless liquid (glass) at room temperature | 0.53 | 257/256 |
| 2 | R = H<br>$R_1$ = $OC_2H_5$<br>$R_2$ = $CH_3$ | Colourless viscous liquid at room temperature | 1.80 | 267/266 |
| 3 | R = H<br>$R_1$ = $OCH_3$<br>$R_2$ = $CH_3$ | Yellow crystalline solid at room temperature. MP about 60° C. | 1.30 | 269/261 |
| 4 | R = H<br>$R_1$ = $CH_3$<br>$R_2$ = $CH_3$ | Yellow crystalline solid at room temperature. | 3.00 | 287/284 |

TABLE-continued

| Compound Number | Substituents for diisopropoxy aluminium diketonate | Physical Characteristics | Vapour Pressure at 120° C. (milli-bars) | Wavelength of Absorption Maximum (nanometers) |
|---|---|---|---|---|
| 5 | R = H<br>$R_1$ = $C(CH_3)_3$<br>$R_2$ = $C(CH_3)_3$ | MP about 105° C. Colourless liquid, thermally unstable | — | 293/— |
| 6 | R = H<br>$R_1$ = $C(CH_3)_3$<br>$R_2$ = $CF_3$ | Brown liquid, thermally unstable | — | 297/— |

For the values of wavelength Absorption Maximum which are given, the first figure gives that for the compound in chloroform solution and the second figure gives the maximum value for the compound vapour.

For deposition of the required metal oxide, Compound 1 was illuminated with the frequency doubled argon ion laser light (257 nanometers) whilst Compounds 3 and 4 were illuminated with a xenon mercury lamp for the 250 to 300 nanometer region.

The precursors and process of the invention thus can permit the deposition of oxides at temperatures which are 200° to 300° C. lower than deposition using non-photochemical techniques. The preferred precursors allow the use of less costly light sources at wavelengths that do not require expensive optics or the removal of oxygen from the light path.

The foregoing description of embodiments of the invention has been given by way of example only and a number of modifications may be made without departing from the scope of the invention as defined in the appended claims. For instance, it is not essential that the technique should be applied only to aluminium compounds and other metals such as titanium, zirconium, strontium may also be suitable. In addition, the substitution of more than a single diketone for the alkoxy groups is also feasible. An area selective deposition of the oxide layer could be effected, for example, by suitable shaping of the light beam which is directed through the window 2 or by moving a laser beam in order to 'write' in the oxide area that is required.

The process is believed also to be suitable for depositing alternative dielectric materials such as nitrides.

We claim:

1. A thin film deposition process in which a dielectric layer may be laid down on a substrate body surface at a comparatively low temperature, the process comprising the steps of taking a metal alkoxy substituted beta-diketonate in vapour form, the metal alkoxy substituted beta-diketone being capable of absorbing light in the wavelength range of 240 to 400 nanometers, heating the substrate body to a temperature below the pyrolytic decomposition temperature of the metal alkoxy substituted beta-diketonate in the presence of the vapour, directing light of a predetermined wavelength in the range of 240 to 400 nanometers towards the substrate to cause a photochemical fragmentation of said vapour molecules, the reaction resulting in a deposition of the corresponding metal oxide on said substrate.

2. A process as claimed in claim 1, wherein in the metal alkoxy substituted beta-diketonate the alpha-substitutions to the oxygen atoms are individually selected from the group consisting of alkyl, fluorinated alkyl, alkoxy and aryl groups, and the beta-substitution to the oxygen atoms is selected from the group consisting of hydrogen, halogen and lower alkyl.

3. A process as claimed in claim 1, in which the wavelength range is 250 to 300 nanometers.

4. A process as claimed in claim 1, in which the metal alkoxy substituted beta-diketonate is aluminium diisopropoxide acetyl acetonate.

* * * * *